United States Patent [19]

Brugh

[11] Patent Number: 5,448,169

[45] Date of Patent: Sep. 5, 1995

[54] PULSED FT NMR EMPLOYING FAST COMBINATION SCALER FOR FASTER OPERATION

[75] Inventor: Richard D. Brugh, San Jose, Calif.

[73] Assignee: Varian Associates, Inc., Palo Alto, Calif.

[21] Appl. No.: 165,761

[22] Filed: Dec. 10, 1993

[51] Int. Cl.⁶ .......................... G01V 3/00; G01V 3/08; G01V 3/14; G01V 3/175

[52] U.S. Cl. .................................. 324/307; 324/309; 324/312; 324/318; 324/322

[58] Field of Search ............... 364/735, 734, 726, 736; 324/307, 300, 309, 310, 311, 312, 313, 318, 319, 320, 321, 322

[56] References Cited

U.S. PATENT DOCUMENTS 5,303,172  4/1994  Magar ..................... 364/726
5,361,373  11/1994  Gilson ..................... 395/800

Primary Examiner—Sandra L. O'Shea
Assistant Examiner—Mack Haynes
Attorney, Agent, or Firm—Gerald M. Fisher

[57] ABSTRACT

An improved FT NMR system capable of faster computations by eliminating the time required to operate a shift register for the scaling in signal averaging. The system employs a combinational circuit which provides the commanded various scaled outputs in 50-80 nanoseconds of a 16 bit data word.

12 Claims, 3 Drawing Sheets

PULSED FT NMR EMPLOYING FAST COMBINATION SCALER FOR FASTER OPERATION

FIELD OF THE INVENTION

This invention relates to signal averaging for Fourier transformation computation in a NMR spectrometer.

BACKGROUND OF THE INVENTION

In many applications it is necessary to measure physical parameters as a function of time and to analyze the data. One such application is required in a Fourier Transform Nuclear Magnetic Resonance (FT NMR) Spectrometer. As illustrated in FIG. 1, a sample material 8 being analyzed in an FT NMR spectrometer 1 is retained in a strong homogenous magnetic field ($H_0$) from a concentric magnet 2 and orthogonally directed repetitive high frequency RF pulses from a transmitter on coax 3 are applied to the sample 8 via probe 7. The magnetic moments of the nuclei of the atoms of the sample material become aligned in the same direction as the $H_0$ field and are perturbed from that alignment by the high frequency pulses. Between each high frequency pulse, the magnetic moment of the nuclei of the sample atom precess around the $H_0$ field in a manner which depends uniquely on the sample's atomic structure and the magnetic forces between its atoms as a consequence of that structure.

As explained in connection with FIG. 1 of U.S. Pat. No. 3,495,680, by detecting the waveform of the signal generated by the processing magnetic moment of the sample nuclei, it is possible to deduce the atomic structure of the sample. A coil of wire in the probe known as the receiver coil (not shown) is placed as closely as possible to the sample material and is spatially aligned orthogonally to the transmitter so as to be insensitive to the driving pulses but to sense any induced voltages in the receiver coil as the magnetic moments of the atoms of the sample precess. This induced signal in the receiver is provided on cable 9 to RF receiver 10 where it is phase detected. The RF receiver coil and audio output is coupled to a time averaging computer where it is sampled at times $t_n$ at uniformly displaced time intervals from the transmitter pulse off time and where the sample value for each time $t_n$ is summed up in a channel of memory.

More modern time averagers employ high speed analog to digital converters (ADC) 6, which sample the received signal voltage at a high speed and convert it to a series of digital numbers. With reference to FIG. 1, modern FT NMR spectrometers employ such an ADC 6 and the averager 5 stores these sample values very accurately referenced to the time of the end of the transmitter pulse via synchronization from Controller/Fourier Transform Computer 4. By performing the sampling and ADC conversion and recording the signal following each of many pulses it is possible to build up a very accurate time domain waveform signal which is the response of the sample nuclei to the high frequency pulses. Since the noise in the received signals are random, by adding K such signals together, the signals will add linearly with K and the random noise will increase with the square root of K. Accordingly, the signal to noise ratio can, in general, be improved by increasing the number of samples. This effect does not continue indefinitely, but it is not unusual to sum for hundreds of thousands of pulses over a period of several hours, or even several days. However, in any such numerical process, there is a practical limit both in the size of the memory in the averaging computer which can be used for this process and in the number of bits used in the computation. Accordingly, in the analysis of such data it becomes desirable to discard the less significant and noisy portion of the data and perform the computations on the most significant data. This can be done by obtaining the average, i.e. dividing the sum of all signals for any point in time by the number of samples taken.

However, this averaging technique would restrict the total number of samples which can be accumulated to a value which is less than the number which would cause overflow of the memory channel which is recording the largest signal. To overcome this problem, the data in each memory channel is evaluated, and whenever the data in a channel would overflow, such channels are scaled. This means that the input data from the ADC also needs to be scaled from then on so that when new data is added to the channel it is consistently valued. Since the conventional ADC converts the analog signal to a binary representation, it has become customary in the art to scale the ADC data by simply shifting the data one bit toward the least significant bit for each factor of two in the division. For example, if the ADC provided 16 bits of resolution, it has become customary to shift the sum data a maximum of 15 places i.e. divide by $2^{15}$. In the prior art, this has been accomplished by loading the data in parallel into a counter, and also loading the number of shifts desired into a second register, then repeatedly shifting the data in the counter by one bit and decrementing the counter. When the counter equaled zero, the remaining contents of the shift register were the desired scaled number.

The difficulty with this shifting technique is that it requires a good deal of time. As the sampling rates have increased, this shifting time, when added to the time required to process the data for each point has become a limiting factor. In addition to this computation speed problem, when carrying out NMR experiments, the number of pulses to be summed, i.e. the sampling time, is a variable which is selected by the experimenters and can vary from minutes to days. Accordingly, the number of shifts for scaling the data also varies and must be considered in such counter scaling. Finally, as the demands on NMR have increased, more computational speed is required, and scaling time has been a limiting factor.

SUMMARY OF THE INVENTION

It is an object of this invention to provide a method and apparatus for obtaining scaling of binary data without a shift register.

It is a further object to provide apparatus for selectively dividing a binary word at very high speed.

It is a further object to provide a time averager for an NMR spectrometer capable of scaling data selectively without a shift register.

It is a feature of the invention that it employs an integrated circuit having an array of two-input multiplexers which can perform a combinatorial division by $2^{15}$ in less that 80 nanoseconds on a 16 bit binary word.

DETAILED DESCRIPTION OF THE INVENTION

Figure 1:
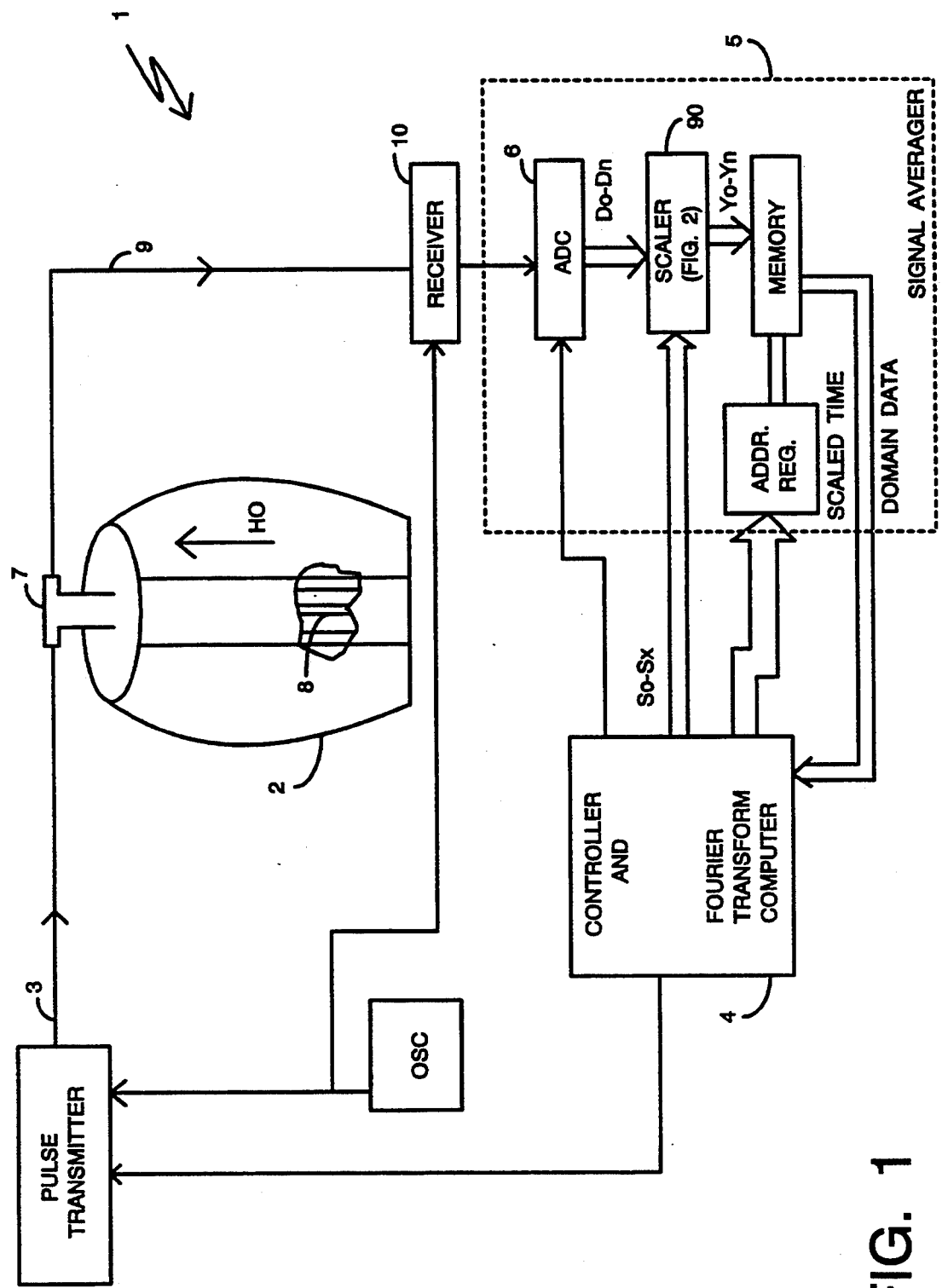
FIG. 1 is a block diagram of a FT NMR spectrometer.

Combinational logic refers to networks whose output is strictly dependent on its inputs. The traditional approach in analyzing a binary function has been to define a Boolean equation which accounts for all possible combinations of conditions and then using various equation minimization approaches to manipulate the equation to a form which is realizable by a simple implementable logic circuit. There are now commercially available devices called Field Programmable Gate Arrays (FPGA). They provide programmable interconnection of logic elements and enable a single chip solution to many logic problems. I have determined that an FPGA can be utilized to provide the scaling functions required for NMR FT computations.

The scaling factor (SF) can be represented as a binary number related to the resolution of the ADC. For our purposes, $$SF = 2^{-N} \qquad (1)$$

where $N \geq 0$ and

N means the programmable shift, which for NMR is one less than the number of bits of resolution provided by the ADC.

Multiplication of a binary number X by $2^{-N}$, is the same as shifting N times to the right. I use $2^{\wedge}(-N)$ to represent the shifting of a binary number by a scale factor N to the right.

Since N is also representable as a binary number, $$N = W_n 2^n + W_{n-1} 2^{n-1} + \ldots W_0 2^0, \qquad (2)$$

it is seen that $$2^{\wedge}(-N) = 2^{\wedge}(-(W_n 2^n + W_{n-1} 2^{n-1} \ldots W_0 2^0)) \qquad (3)$$

$$2^{\wedge}(-N) = 2^{\wedge}(-W_n 2^n) \cdot 2^{\wedge}(-W_{n-1} 2^{n-1}) \cdot \ldots 2^{\wedge}(-W_0 2^0) \qquad (4)$$

For the situation where a 5 bit ADC is employed the scaling can be to divide by any number less than 16, $0 \leq M \leq 15$. Therefore, $$N = D \cdot 8 + E \cdot 4 + F \cdot 2 + G \cdot 1 \qquad (5)$$

where D, E, F and G are 0 or 1, and $$2^{\wedge}(-N) = 2^{\wedge}(-8D) \cdot 2^{\wedge}(-4E) \cdot 2^{\wedge}(-2F) \cdot 2^{\wedge}(-G) \qquad (6)$$

Since each of the terms of equation (6) are in the product form, I conceived that the scaling can be accomplished by a series of combinatorial circuits. Specifically, each term can be readily implemented in hardware using a column of multiplexers having 2 data inputs A and B, a selector S and an output Y, since variables D, E, F and G above can have only the two values 1 or 0. The truth table for the multiplexer is:

| S | Y |
|---|---|
| 0 | A |
| 1 | B |

Figure 2:
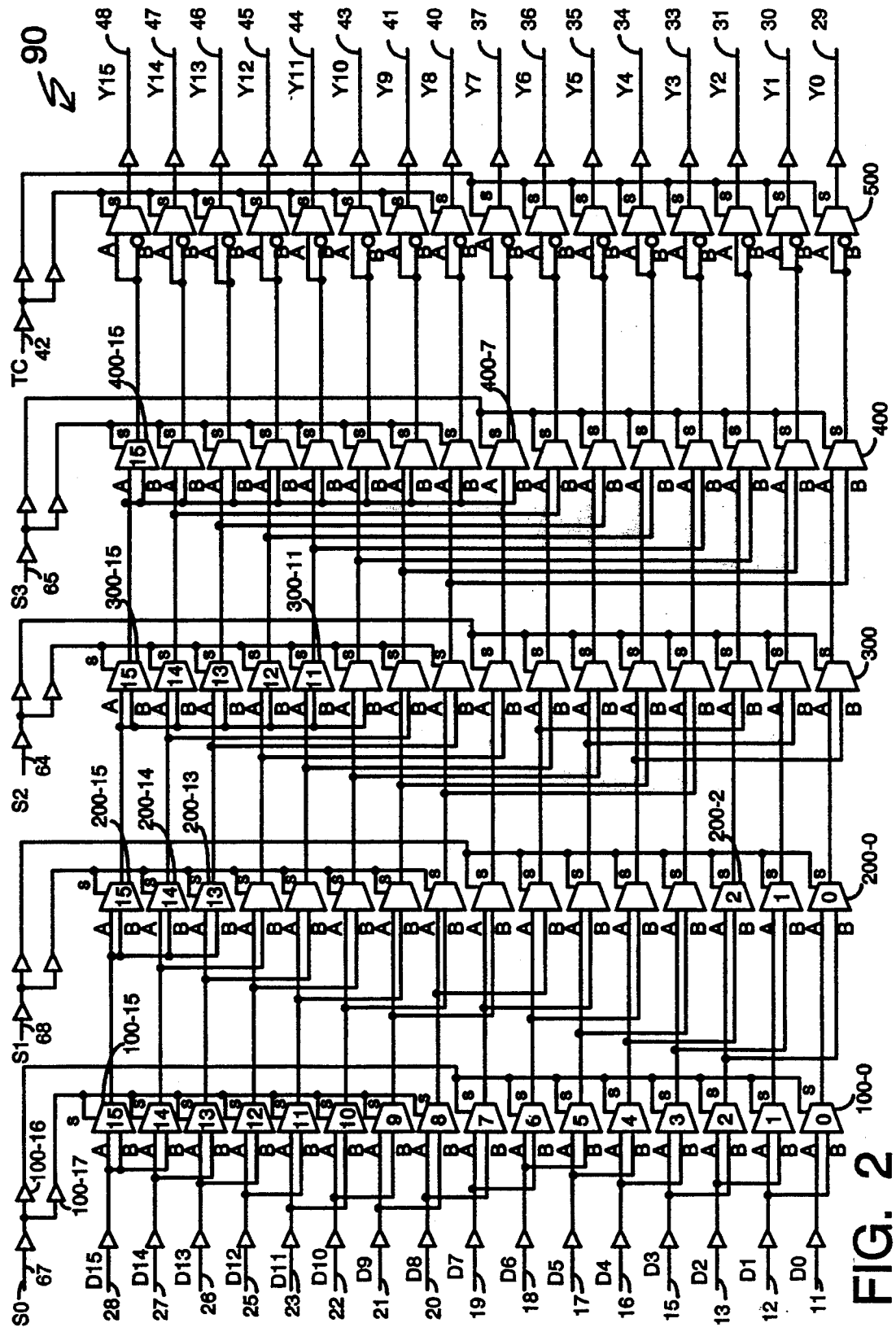
FIG. 2 is a combinational high speed scaling circuit.

With reference to FIG. 2, the incoming data bits lines D0–D15 on the left side of the drawing will input a 16 bit data word to the combinational network of my invention. The input word D0–D15 is to be divided by a programmable scale factor. The scale factor is input at the four terminals designated S0, S1, S2, S3 on the top of FIG. 2. These four bits provide the capability of dividing by any number from $2^0$ to $2^{15}$ and together comprise the multiplier N as defined above. The scaled outputs are along the right side of the drawing and are designated Y0–Y15. Also, another input to the network at the top of FIG. 2 is a complementing control command Tc at terminal 42 which will selectively reverse the polarity of all the output data of the network.

The network of FIG. 2, includes a first column 100 of identical MUX elements having A and B inputs either one of which can be switched to its output by the level of the input on the "S" terminal. Columns 200, 300 and 400 have the same number of identified MUX elements as column 100 MUX elements. The MUX elements of column 500 have an inverter connected to invert the signal B, but otherwise column 500 also contains the same number of MUX elements.

In column 100, the "B" input of each MUX, except for the D15 stage, is connected to the A input of the next higher bit, i.e. terminal 12, bit D1 is connected to both its corresponding MUX input A and the input B of the MUX 100-0 corresponding to bit D0. The D15 data bit is the sign bit which is 0 for positive data and 1 for negative data. The sign bit data is connected to both input A and B of the MUX 100-15 corresponding to D15 and to the B input of the MUX corresponding to bit D14. The S input of each MUX in column 100 is connected to the S0 terminal 67 through a pair of buffers. Two buffers 100-16 and 100-17 are provided to satisfy current fan out requirements. When S0 is a zero, the data bit on the A input of each MUX in column 100 is connected to the MUX output Y. The data bits D0–D15 bits are all coupled through a buffer to the A terminal of the corresponding MUX. The buffer is a standard pair of series connected CMOS inverters.

In column 200, the B input of each MUX is connected to the A input of the second higher bit, i.e. input B of MUX 200-0 is connected to input A of MUX 200-2. The sign bit MUX 200-15 has its input A connected to B input of MUX 200-14 and MUX 200-13. The scaler bit S1 is coupled through buffers to the S input on all MUX's of the column 200. All A inputs in column 200 MUX's are connected to the output of the corresponding column 100 MUX's.

Column 300 MUX elements are similarly connected except that the B input of each MUX is connected to the data bit of fourth higher input A and the sign bit is connected to input B of MUX 300-15 through MUX 300-11. Scale factor bit S2 is connected to each of the S inputs.

Column 400 MUX elements are also similarly connected except that the B input of each MUX is connected to the A input of the eight bit higher MUX and the B input of the upper most MUX's 400-15 through 400-7 are connected to the sign bit. Scale factor bit S3 is connected to the S input on each MUX in column 400.

Column 500 is part of the scaling circuit which provides the 1's complement of the output word of column 400. The MUX's in column 500 will invert the signal on input B and since input A and input B are connected together whenever the TC command, 42, is set to one, the complement output is provided of the word on input A at output terminals Y0–Y15.

Using the 16 possible combinations of S0 through S3, the data can be shifted anywhere from zero places to 15 places to the right.

As seen in the following table, which contains various selected outputs for various inputs, positive and negative input numbers can be shifted by this network, provided that when negative numbers are represented D15 is high. In these systems requiring negative numbers, this circuit will provide the 1's complement and the conversion to 2's complement can be accomplished in circuits external to this circuit.

TABLE 1

| INPUT [15:0] | SHIFT [3.0] | COMP BIT | OUTPUT (15:0) | COMP BIT | OUTPUT [15:0] |
|---|---|---|---|---|---|
| 7FFF | 0 | 0 | 7FFF | 1 | 8000 |
| 7FFF | 1 | 0 | 3FFF | 1 | C000 |
| 7FFF | 2 | 0 | 1FFF | 1 | E000 |
| 7FFF | 4 | 0 | 07FF | 1 | F800 |
| 7FFF | 8 | 0 | 007F | 1 | FF80 |
| 7FFF | F | 0 | 0000 | 1 | FFFF |
| 8000 | 0 | 0 | 8000 | 1 | 7FFF |
| 8000 | 1 | 0 | C000 | 1 | 3FFF |
| 8000 | 2 | 0 | E000 | 1 | 1FFF |
| 8000 | 4 | 0 | F800 | 1 | 07FF |
| 8000 | 8 | 0 | FF80 | 1 | 007F |
| 8000 | F | 0 | FFFF | 1 | 0000 |

Figure 3A:
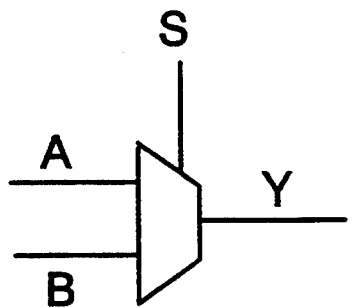
FIG. 3A is a multiplexer unit.
Figure 3B:
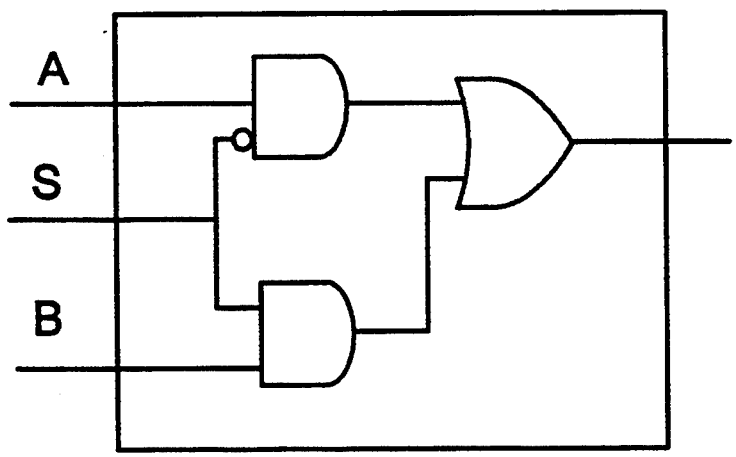
FIG. 3B is an AND circuit network.

The AND circuit network of FIG. 3B has the equivalent truth table as the MUX circuit of FIG. 3A. Accordingly, each MUX in the FIG. 2 could be replaced by the circuit of FIG. 3B. There are other logically equivalent circuits which can likewise provide the same functional truth table. The MUX circuit of FIG. 3A has been selected for this application because it is compact and because the commercially available field programmable gate array (FPGA) large scale integrated circuits from ACTEL Corporation employ an array of 2-input multiplexers which are ideally suited for this application.

The FIG. 2 embodiment employs 64 multiplexers for a 4-bit scale factor. For $N \geq 31$, there would be 5 columns using 160 MUX's. The formula for determining the number of MUX's is that for a shift of $N < 2^k - 1$ a total of $k \times 2^k$ multiplexers are required where $k = 5$.

With reference to FIG. 1, it can be seen that the scaler circuit 90 of FIG. 2 receives the sampled binary data $D_0-D_n$ from ADC 6 and scale factor control signals $S_0-S_x$ from controller/computer 4. Responsive to these scale factors, the scaler 90 provides $Y_0-Y_n$ appropriately scales for the specific $t_n$ channel.

Other embodiments could be envisioned to accomplish the objectives of the invention. Accordingly, the scope of the invention should not be restricted to the particular embodiments diclosed, but should be controlled by the claims. With this in view,

What is claimed is:

1. In an FT NMR system including an NMR probe in a fixed magnetic $H_0$ field; a pulse transmitter coupled to a NMR probe; a controller, said transmitter pulse timing being responsive to said controller; a receiver, said receiver coupled to said NMR probe for receiving and detecting the NMR sample signal responsive to said transmitter pulses; and said receiver output being said NMR sample signal; an ADC, said receiver output being sampled by said ADC, said ADC having an output; a signal averager including memory, said signal averager and said ADC being synchronized by said controller, said ADC output average being processed by a scaler, said scaler having an output; a Fourier transform (FT) computer, said scaler output being connected to said memory; the improvement comprising:
said scaler being an x·n array of unit cells where x is the number of columns and n is the number of rows of said array comprising a combinational network having an input and an output, said input to said combinational network being a data word having data bits $D_0-D_n$, said combinational network having scaler control input data bits $S_0-S_x$; said combinational network output being data bits $Y_0-Y_n$ where $$Y_0-Y_n = 2^{(-N)}(D_0-D_n)$$

where $$N = S_0 2^x + S_1 2^{x-1} + S_2 2^{x-2} + \ldots S_x 2^{x-x}$$

where x is an integer greater than or equal to 0 and where $x < N$.

2. The system of claim 1 wherein said combinational network comprises a plurality of unit cells wherein the unit cell has an A, B and S input and a Y output and wherein the truth table is:

| S | Y |
|---|---|
| 0 | A |
| 1 | B |

3. The system of claim 2 wherein said unit cell is a multiplexer (MUX).

4. The system of claim herein the MUX's of column 0 are controlled by scaler control bit 0 to select either said A or B input for said $Y_0$ output; and the MUX's of column 1 are controlled by scaler control bit 1 to select either said A or B input for said $Y_1$ output.

5. The system of claim 4 wherein of the data bit input terminals $D_0-D_n$ is connected to the A input of a corresponding MUX in column 0.

6. The system of claim 5 wherein the B input of each MUX of column x is connected to the A input of the MUX in column x which is $2^x$ bits more significant.

7. The system of claim 6 wherein $4 \geq x \geq 0$.

8. The system of claim 7 wherein the sign bit terminal of the input data is connected to the A and B input of the corresponding MUX in column 0.

9. The system of claim 8 wherein the sign bit is also connected to the B input of each MUX of column x which is $2^x$ bits less significant than the sign bit.

10. (amended) The system of claim 9 wherein said array includes an additional column x+1 and wherein the Y output of each MUX in column x is connected to the A input of the corresponding MUX in column x+1.

11. The system of claim 10 wherein said MUXs of said additional column x+1 are of a second type of MUXs having an A, B and S input, said second type of MUXs having Y output; said second type of MUX further comprising an inverter circuit coupled to its B input.

12. The system of claim 11 wherein the output of the last column of MUXs is connected to both the corresponding A and B input of said second type of MUX, whereby the output of the second type of MUX can be switched between $Y_0-Y_n$ and its inverse $\overline{Y_0}-\overline{Y_n}$ to provide a selectable ones complement.

* * * * *